(12) United States Patent
Lin et al.

(10) Patent No.: US 12,080,375 B2
(45) Date of Patent: *Sep. 3, 2024

(54) CIRCUITS AND METHODS FOR COMPENSATING A MISMATCH IN A SENSE AMPLIFIER

(71) Applicant: Taiwan Semiconductor Manufacturing Co., Ltd., Hsinchu (TW)

(72) Inventors: Ku-Feng Lin, New Taipei (TW); Yu-Der Chih, Hsin-Chu (TW); Yi-Chun Shih, Taipei (TW); Chia-Fu Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/232,768

(22) Filed: Aug. 10, 2023

(65) Prior Publication Data
US 2023/0386528 A1    Nov. 30, 2023

Related U.S. Application Data

(63) Continuation of application No. 17/737,734, filed on May 5, 2022, now Pat. No. 11,783,873, which is a
(Continued)

(51) Int. Cl.
*G11C 7/06*    (2006.01)
*G11C 7/08*    (2006.01)
(Continued)

(52) U.S. Cl.
CPC ............. *G11C 7/065* (2013.01); *G11C 7/08* (2013.01); *G11C 11/14* (2013.01); *G11C 13/004* (2013.01); *H01L 27/10* (2013.01)

(58) Field of Classification Search
CPC .......... G11C 7/065; G11C 7/08; G11C 7/062; G11C 11/14; G11C 13/004; G11C 29/028;
(Continued)

(56) References Cited

U.S. PATENT DOCUMENTS 10,957,366 B2 * 3/2021 Lin .................... G11C 11/14
11,373,690 B2 * 6/2022 Lin ..................... G11C 13/004
(Continued)

FOREIGN PATENT DOCUMENTS

JP    2012053982 A    3/2012

OTHER PUBLICATIONS

Semiconductor Memory Device; Arai Koji (Year: 2012).

*Primary Examiner* — Sultana Begum
(74) *Attorney, Agent, or Firm* — Duane Morris LLP

(57) ABSTRACT

Circuits and methods for compensating mismatches in sense amplifiers are disclosed. In one example, a circuit is disclosed. The circuit includes: a first branch, a second branch, a first plurality of trimming transistors and a second plurality of trimming transistors. The first branch comprises a first transistor, a second transistor, and a first node coupled between the first transistor and the second transistor. The second branch comprises a third transistor, a fourth transistor, and a second node coupled between the third transistor and the fourth transistor. The first node is coupled to respective gates of the third transistor and the fourth transistor. The second node is coupled to respective gates of the first transistor and the second transistor. The first plurality of trimming transistors is coupled to the second transistor in parallel. The second plurality of trimming transistors is coupled to the fourth transistor in parallel.

10 Claims, 13 Drawing Sheets

Related U.S. Application Data continuation of application No. 17/156,383, filed on Jan. 22, 2021, now Pat. No. 11,373,690, which is a continuation of application No. 16/400,222, filed on May 1, 2019, now Pat. No. 10,957,366.

(60) Provisional application No. 62/675,947, filed on May 24, 2018.

(51) Int. Cl.
*G11C 11/14* (2006.01)
*G11C 13/00* (2006.01)
*H01L 27/10* (2006.01)

(58) Field of Classification Search
CPC .......... G11C 29/026; G11C 2029/1206; G11C 2207/2254; H01L 27/10
See application file for complete search history.

(56) References Cited

U.S. PATENT DOCUMENTS

| | | | |
|---|---|---|---|
| 11,574,657 B2 * | 2/2023 | Lin | G11C 7/065 |
| 11,783,873 B2 * | 10/2023 | Lin | G11C 29/026 |
| | | | 365/189.09 |
| 11,854,650 B2 * | 12/2023 | Lin | G11C 7/065 |
| 2004/0108526 A1 | 6/2004 | Takahashi et al. | |
| 2006/0152970 A1 | 7/2006 | DeBrosse et al. | |
| 2018/0204615 A1 | 7/2018 | Katayama | |
| 2019/0319621 A1 | 10/2019 | Kim | |

* cited by examiner

CIRCUITS AND METHODS FOR COMPENSATING A MISMATCH IN A SENSE AMPLIFIER

CROSS-REFERENCE TO RELATED APPLICATIONS

This application is a continuation of U.S. patent application Ser. No. 17/737,734, filed May 2022, which is a continuation of U.S. patent application Ser. No. 17/156,383, filed on Jan. 22, 2021, which is a continuation of U.S. patent application Ser. No. 16/400,222, filed on May 1, 2019, now U.S. Pat. No. 10,957,366, issued on Mar. 23, 2021, which claims priority to U.S. Provisional Patent Application No. 62/675,947, filed on May 24, 2018, each which is incorporated by reference herein in their entireties.

BACKGROUND

The improvement in integration density of electronic components (e.g., transistors, diodes, resistors, capacitors, etc.) in integrated circuits (IC) has come from shrinking the semiconductor process node, which entails reductions in operating voltage and current consumption of electronic circuits developed in the semiconductor process node. Accordingly, access speed of memory integrated circuits is expected to become faster. For example, some memories have a very small read window, which requires a low-offset sense amplifier for a successful read operation.

A mismatch or offset between components often exists in a sense amplifier circuit due to unavoidable process variations. According to an existing method, a sense amplifier undergoes an offset sampling or cancelling stage before an actual read operation to cancel out the mismatch of the sense amplifier circuit. But this cancellation needs to be performed before each read operation. In addition, the offset-cancelling sense amplifiers cannot cancel the variations of reference cells, which are usually used in a read path design and suffer process variations.

Thus, existing devices and methods for improving insertion loss performance are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION OF EXEMPLARY EMBODIMENTS

Figure 1:
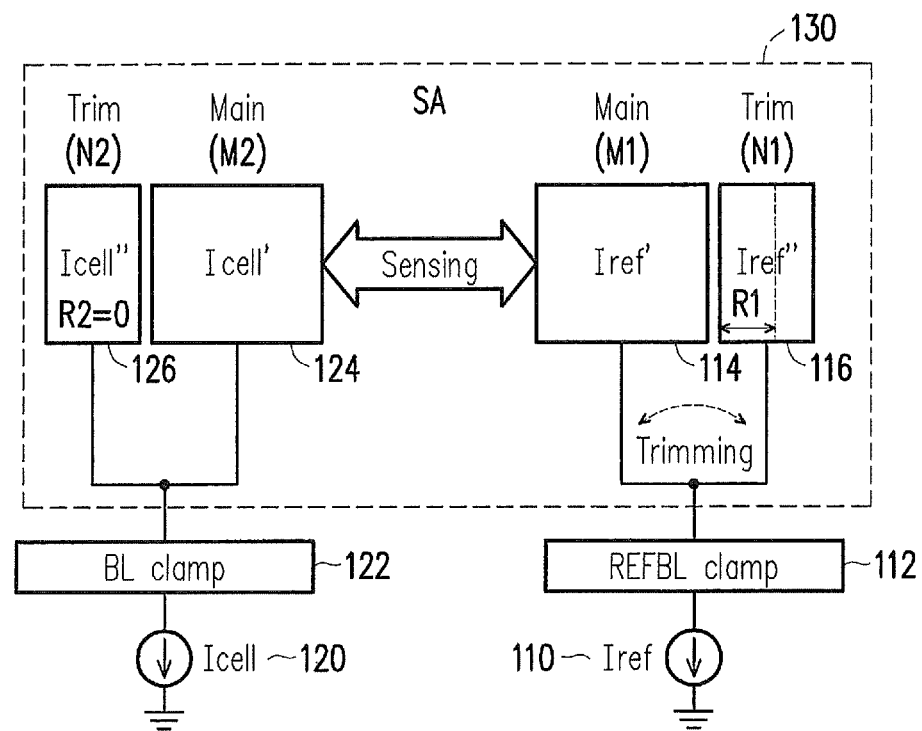
FIG. 1 illustrates a diagram of an exemplary circuit for a sense amplifier, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Some embodiments of the present disclosure include reading the logic state of a memory bit cell using a sense amplifier while taking into account the offset and mismatch of the sense amplifier. Based on various embodiments, trimming branches are added to eliminate the need to sample or cancel the offset before reading the logic state, taking into account all possible offsets without read latency.

The present teaching discloses circuits and methods for compensating a mismatch in a sense amplifier. In one embodiment, a sense amplifier circuit comprises two branches: a first branch and a second branch. One or more trimming branches are connected to each of the two main branches in parallel. Each trimming branch may be identical or similar to the corresponding main branch. Each trimming branch, when individually turned on, reduces the signal level of the current flowing through the corresponding main branch by a certain percentage. When there is a mismatch in the sense amplifier indicating, e.g. a stronger current flowing through the first branch than that flowing through the second branch, at least one of the trimming branches corresponding to the first branch is selected to be turned on to reduce the current flowing through the first branch to compensate the mismatch. The quantity of trimming branches selected to be turned on is determined based on the certain percentage and the mismatch. For example, if the certain percentage for each trimming branch is 1% and if the mismatch indicates a 3% higher current in the first branch, 3 trimming branches connected to the first branch will be turned on to reduce the current of the first branch by 3%. In one embodiment, the mismatch in the sense amplifier is due to an offset between the threshold voltages of a pair of transistors in the sense amplifier. With the proposed method, a threshold voltage of a transistor in the sense amplifier is digitally tunable by adjusting the trimming branches that are turned on. As such, an optimal threshold of the transistor in the sense amplifier can be determined and stored on-chip for in-field use during manufacturing test.

The disclosed method can cancel not only sense amplifier mismatch but also reference cell variations by trimming, i.e. adjusting the trimming branches that are turned on, in accordance with some embodiments. In some embodiments, the trimming operation is done once during the manufacturing stage. There is no need to perform the trimming during read operation. As such, the disclosed method does not induce reading latency penalty to sample or compensate the sense amplifier offset during read operation. The present disclosure is applicable to any sense amplifier circuit that may have mismatch among its components.

FIG. 1 illustrates a diagram of an exemplary circuit 100 for a sense amplifier, in accordance with some embodiments of the present disclosure. In some embodiments, the exemplary circuit 100 is utilized as part of a readout circuit attached to a memory array that may include magnetic random access memory (MRAM) bits, resistive random access memory (RRAM, ReRAM) bits, or the like. As shown in FIG. 1, the exemplary circuit 100 includes a cell current source 120 and a reference current source 110. The cell current source 120 has a cell current Icell based on a logical state (e.g., high or low) of a memory bit of the memory array. The reference current source 110 generates a reference current Iref as a point of reference for determining the logical state of the memory bit by the cell current Icell.

In one embodiment, the cell current source 120 and the reference current source 110 are implemented as a first memory bit cell and a second memory bit cell, respectively. The first memory bit cell presents a first resistance state; and the second memory bit cell presents a second resistance state that is different from the first resistance state. In some embodiments, respective first ends of the first and second memory cells are applied with a fixed voltage and respective second ends of the first and second memory cells are tied to ground, which causes first and second currents with respective signal levels flowing through the first and second memory bit cells, respectively.

As shown in FIG. 1, the exemplary circuit 100 further includes a bit line clamp 122 coupled to the cell current source 120, a reference bit line clamp 112 coupled to the reference current source 110, and a sense amplifier 130 electrically connected to the bit line clamp 122 and the reference bit line clamp 112. The sense amplifier 130 senses a difference between Iref' and the Icell' during a normal operation. The sense amplifier 130 includes two main branches M1 114 and M2 124. Due to symmetric structures of the two main branches, the reference current Iref' flowing through the main branch M1 114 should be the same as the cell current Icell' flowing through the main branch M2 124 during a tuning process of the sense amplifier 130 when there is no mismatch between the two main branches. But due to the unavoidable process variations, a mismatch exists between the two main branches M1 114 and M2 124 to cause a difference between the Iref' and the Icell' during a tuning process of the sense amplifier 130, i.e. a difference between the baselines of the Iref' and the Icell'. Unless stated otherwise, the following descriptions will focus on compensating a mismatch of a sense amplifier during the tuning process of the sense amplifier, and the currents Iref, Icell, Iref' and Icell' will all refer to baseline currents during the tuning process.

As shown in FIG. 1, the sense amplifier 130 further includes trimming branches N1 116 and N2 126. The trimming branch N1 116 may include a plurality of transistors or sub-branches connected to the main branch M1 114 in parallel. The trimming branch N2 126 may include a plurality of transistors or sub-branches connected to the main branch M2 124 in parallel. Each transistor or sub-branch in the trimming branch N1 116 and the trimming branch N2 126 can be turned on or off based on a mismatch in the exemplary circuit 100, e.g. a difference between the Iref' and the Icell' before mismatch compensation. Each of the trimming branch N1 116 and the trimming branch N2 126 can have a portion of its sub-branches to be turned on and a portion of its sub-branches to be turned off. As shown in FIG. 1, the ratio of turned on sub-branches in the trimming branch N1 116 is represented as R1, while the ratio of turned on sub-branches in the trimming branch N2 126 is represented as R2.

In this embodiment, the main branch M1 114 is equivalent to M1 sub-branches connected in parallel; and the main branch M2 124 is equivalent to M2 sub-branches connected in parallel. In addition, the trimming branch N1 116 includes N1 sub-branches connected to the main branch M1 114 in parallel; and the trimming branch N2 126 includes N2 sub-branches connected to the main branch M2 124 in parallel. Each of the M1 sub-branches, M2 sub-branches, N1 sub-branches and N2 sub-branches may be identical or similar, such that each sub-branch, when individually turned on, can divert or trim a same amount of current.

In one embodiment, each of M1, M2, N1, N2 is a non-negative integer. As such, when there is a ratio R1 (0~100%) of sub-branches turned on in the trimming branch N1 116, the Iref' and the Iref has the following relationship: Iref'=Iref*[M1/(M1+N1*R1)]. That is, the N1*R1 turned on sub-branches divert or trim the original current Iref flowing through the main branch M1 114, leaving the current Iref' in the main branch M1 114. Specifically, when R1=0, Iref'=Iref, which means no trimming on the main branch M1 114. When R1=100%, all sub-braches in the trimming branch N1 116 are turned on to trim the main branch M1 114. Similarly, when there is a ratio R2 (0~100%) of sub-branches turned on in the trimming branch N2 126, the Icell' and the Icell has the following relationship: Icell'=Icell*[M2/(M2+N2*R2)]. That is, the N2*R2 turned on sub-branches divert or trim the original current Icell flowing through the main branch M2 124, leaving the current Icell' in the main branch M2 124. Specifically, when R2=0, Icell'=Icell, which means no trimming on the main branch M2 124. When R2=100%, all sub-braches in the trimming branch N2 126 are turned on to trim the main branch M2 124.

In this example, M1, M2, N1, N2 are determined before or during the manufacturing of the main branches and the trimming branches. The ratios R1 and R2 are programmable and determined during the mismatch compensation after the manufacturing of the main branches and the trimming branches. In one example, it is detected that the Iref shifted 5% higher than baseline due to process variation in the manufacturing of the main branches and the trimming branches. That is, a 5% mismatch exists in the exemplary circuit 100 and indicates that the reference side is 5% stronger than the cell side or the baseline average. Then for mismatch compensation, the ratio R2 is set to 0 and the ratio R1 is set based on the following equation: N1*R1=5%*M1. That is, no trimming on the cell main branch M2 124, while the reference main branch M1 114 is trimmed by 5%*M1 turned on sub-branches to have the current Iref'=Iref*{M1/[M1*(1+5%)]} left in the reference main branch M1 114. In this manner, both Iref' and Icell' go back to the same baseline after the mismatch compensation. In one embodiment, N1*R1 is not an integer. Then an integer closest to the N1*R1 can be used to determine the number of turned on sub-branches in the trimming branch N1 116.

In some embodiments, the mismatch compensation as shown in FIG. 1 is performed once before the usage of the sense amplifier 130. There is no compensation or cancel mismatch each time when the sense amplifier 130 operates or reads information. The trimming range for mismatch compensation is determined by M1, M2, N1, N2. As discussed in the previous paragraph, the trimming resolution is determined by R1 and R2 which are programmable or adjustable based on mismatch condition of the sense amplifier 130. With a reduced or compensated mismatch, the sense amplifier 130 will have a better minimum read window, which means a faster read speed.

Figure 2:
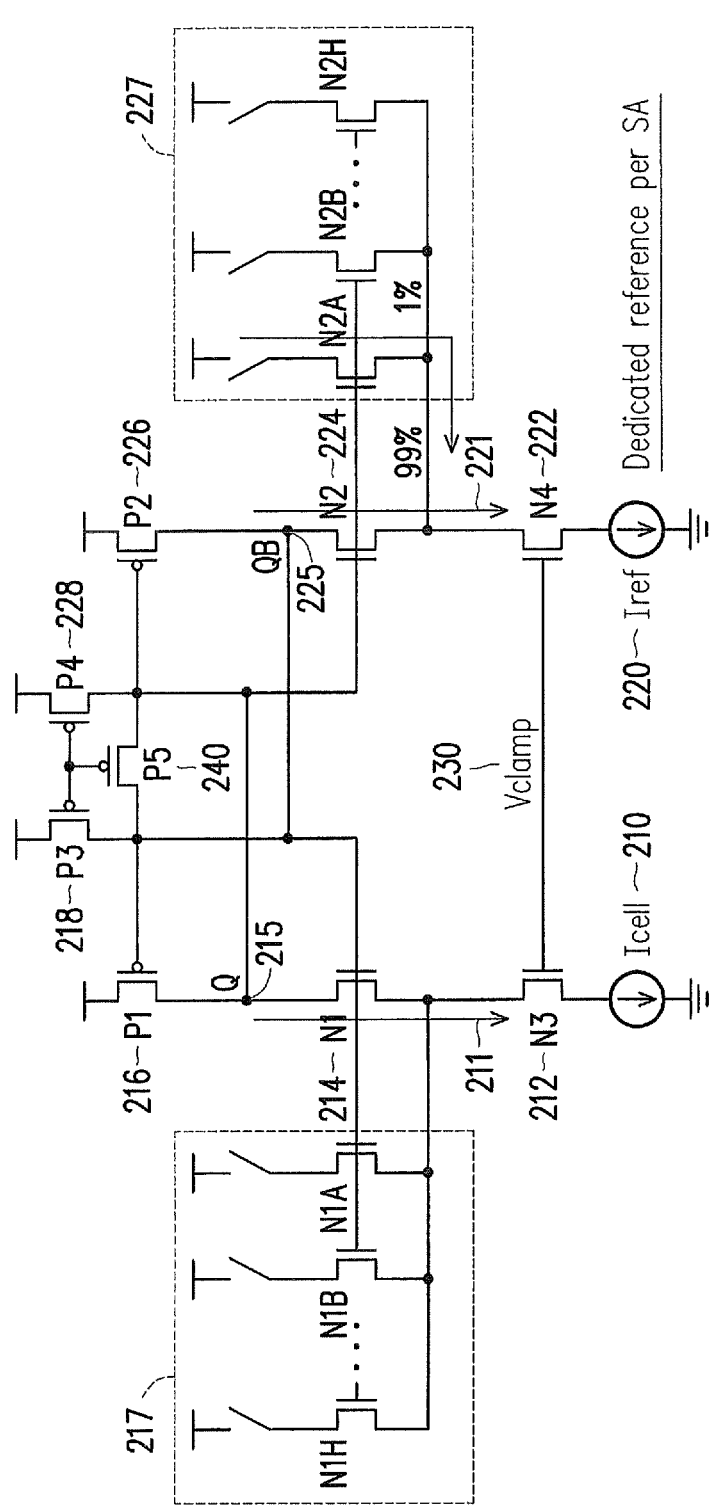
FIG. 2 illustrates an exemplary circuit for compensating a mismatch of a sense amplifier, in accordance with some embodiments of the present disclosure.

FIG. 2 illustrates an exemplary circuit 200 for compensating a mismatch of a sense amplifier, in accordance with some embodiments of the present disclosure. In one embodiment, the exemplary circuit 200 shows a transistor level circuit corresponding to the diagram of exemplary circuit 100 shown in FIG. 1. As shown in FIG. 2, the exemplary circuit 200 includes a cell current source 210 and a reference current source 220. The cell current source 210 has a cell current Icell based on a logical state (e.g., high or low) of a memory bit of the memory array. The reference current source 220 generates a reference current Iref as a point of dedicated reference for determining the logical state of the memory bit by the cell current Icell.

As shown in FIG. 2, the exemplary circuit 200 further includes a first branch comprising a first transistor P1 216, a second transistor N1 214, and a first node Q 215 coupled between the first transistor P1 216 and the second transistor N1 214. In addition, the exemplary circuit 200 further includes a second branch comprising a third transistor P2 226, a fourth transistor N2 224, and a second node QB 225 coupled between the third transistor P2 226 and the fourth transistor N2 224. The first node Q 215 is coupled to respective gates of the third transistor P2 226 and the fourth transistor N2 224. The second node QB 225 is coupled to respective gates of the first transistor P1 216 and the second transistor N1 214. As such, the first transistor P1 216, the second transistor N1 214, the third transistor P2 226, and the fourth transistor N2 224 form a cross-couple latch structure to amplify the sensed differential signal between the first node Q 215 and the second node QB 225.

In addition, the exemplary circuit 200 further includes a first plurality of trimming transistors 217 coupled to the second transistor N1 214 in parallel and a second plurality of trimming transistors 227 coupled to the fourth transistor N2 224 in parallel. As shown in FIG. 2, the first plurality of trimming transistors 217 includes transistors N1A, N1B . . . N1H, each of which is electrically connected to a respective switch. The second plurality of trimming transistors 227 includes transistors N2A, N2B . . . N2H, each of which is electrically connected to a respective switch In some embodiments, each of the first and second pluralities of trimming transistors 217, 227 are controlled (e.g., turned on or off) by the respective switch. As such, each of the first plurality of trimming transistors 217 is capable of being selectively conducted to reduce a first signal level of current flowing through the first branch, while each of the second plurality of trimming transistors 227 is capable of being selectively conducted to reduce a second signal level of current flowing through the second branch. For example, by turning on the transistor N1A and turning off the other transistors in the transistors 217, the current of the first branch is reduced by 1%. By turning on the transistors N2A, N2B and turning off the other transistors in the transistors 227, the current of the second branch is reduced by 2%.

In one embodiment, each of the first plurality of trimming transistors 217, when individually conducted, reduces the first signal level of current flowing through the first branch by a first percentage, while each of the second plurality of trimming transistors 227, when individually conducted, reduces the second signal level of current flowing through the second branch by a second percentage. In the example shown in FIG. 2, each of the first percentage and the second percentage is 1%, and there are eight trimming transistors on each side, i.e. trimming transistors N1A, N1B . . . N1H on the cell side, and trimming transistors N2A, N2B . . . N2H on the reference side. The number eight of the trimming transistors is merely exemplary, where other numbers are within the scope of the disclosure.

The sense amplifier circuit 200 senses a difference between the current 211 flowing through the first node Q 215 and the current 221 flowing through the second node QB 225 during a normal operation. Due to symmetric structures of the sense amplifier circuit 200, the current 211 flowing through the first node Q 215 should have a same baseline as the current 221 flowing through the second node QB 225 during a tuning process when there is no mismatch between the two branches. For example, the second transistor N1 214 and the fourth transistor N2 224 are manufactured based on a same process and should match each other when there is no process variation; the first transistor P1 216 and the third transistor P2 226 are manufactured based on a same process and should match each other when there is no process variation. But due to the unavoidable process variations, a mismatch can exist between the first transistor P1 216 and the third transistor P2 226, between the second transistor N1 214 and the fourth transistor N2 224, etc., to cause a difference between the current 211 and the current 221 during a tuning process.

To compensate a mismatch between the baselines of the current 211 flowing through the first node Q 215 and the current 221 flowing through the second node QB 225, one or more of the trimming transistors 217, 227 may be turned on or conducted to reduce or trim current flowing through the first node Q 215 and/or the second node QB 225. Turning on and off a trimming transistor may be based on a digitally controlled switch (as the switches connected to the transistors 217, 227), a program, or a manual operation. In one example, the mismatch indicates a stronger current flowing through the first node Q 215 than that flowing through the second node QB 225. Then the first plurality of trimming transistors 217 comprises a first number of conducted trimming transistors to reduce the first signal level of current 211 flowing through the first branch to compensate the mismatch. The first number is determined based on the first percentage and the mismatch. For example, if the first percentage is 1% and the mismatch is 4%, the first number is 4=4%/1%. In another example, the mismatch indicates a stronger current flowing through the second node QB 225 than that flowing through the first node Q 215. Then the second plurality of trimming transistors 227 comprises a second number of conducted trimming transistors to reduce the second signal level of current 221 flowing through the second branch to compensate the mismatch. The second number is determined based on the second percentage and the mismatch. For example, if the second percentage is 1% and the mismatch is 2%, the second number is 2=2%/1%. As shown in FIG. 2, each of the second plurality of trimming transistors N2A, N2B . . . N2H 227, when individually conducted, reduces the second signal level of current 221 flowing through the second branch by 1%. That is, the fourth transistor N2 224 is equivalent to 100 N2A trimming transistors connected in parallel. When N2A is turned on and N2B . . . N2H are turned off, the current flowing through the second node QB 225 is trimmed from 100% to 99%.

As shown in FIG. 2, the exemplary circuit 200 further includes a first clamping transistor 212 coupled to the cell current source 210, and a second clamping transistor 222 coupled to the reference current source 220. In one embodiment, both the cell current source 210 and the reference current source 220 are memory bit cells. The first signal level of the current 211 serves as a cell signal for the sense amplifier, while the second signal level of the current 221 serves as a reference signal for the sense amplifier. A clamping voltage Vclamp 230 may be coupled to the respective gates of the first clamping transistor 212 and the second clamping transistor 222 to set a cap or upper limit on the gate voltages for the bit line (cell side) and the reference bit line (reference side).

In addition, the exemplary circuit 200 further includes a transistor P3 218 coupled to the second node QB 225, a transistor P4 228 coupled to the first node Q 215, and a transistor P5 240 connected between the respective gates of the first transistor P1 216 and the third transistor P2 226. The respective gates of the transistor P3 218, the transistor P4 228, and the transistor P5 240 are coupled to each other in this exemplary memory structure. Other memory structures may also be applied with trimming branches added as disclosed herein for mismatch compensation.

In some embodiments, the mismatch compensation as shown in FIG. 2 is performed once before the usage of the sense amplifier. Once each trimming transistor is configured or adjusted to be turned on or off for mismatch compensation, the configurations are recorded and there is no compensation or cancel of mismatch each time the sense amplifier operates or reads.

Figure 3:
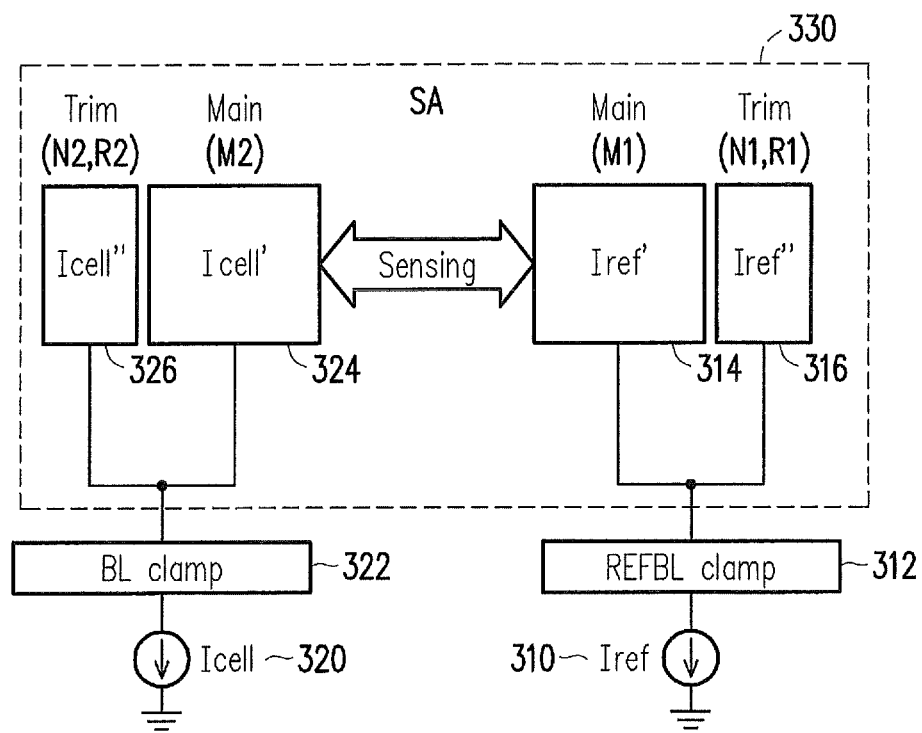
FIG. 3 illustrates a diagram of an exemplary circuit for compensating a mismatch of a sense amplifier, in accordance with some embodiments of the present disclosure.

FIG. 3 illustrates a diagram of an exemplary circuit 300 for compensating a mismatch of a sense amplifier, in accordance with some embodiments of the present disclosure. The exemplary circuit 300 includes a cell current source 320, a reference current source 310, a bit line clamp 322 coupled to the cell current source 320, a reference bit line clamp 312 coupled to the reference current source 310, and a sense amplifier 330 electrically connected to the bit line clamp 322 and the reference bit line clamp 312. The sense amplifier 330 includes two main branches M1 314 and M2 324 and senses a difference between the Iref' and the Icell' during a normal operation.

The sense amplifier 330 further includes trimming branches (N1, R1) 316 connected to the main branch M1 314 in parallel and trimming branches (N2, R2) 326 connected to the main branch M2 324 in parallel. That is, the trimming branches are located within the sense amplifier 330 to trim the currents of main branches when there is a mismatch between the baselines of the Iref' and the Icell'. As discussed above, the trimming range for mismatch compensation is determined by M1, M2, N1, N2, while the trimming resolution is determined by R1 and R2 which are programmable or adjustable based on mismatch condition of the sense amplifier 330. In one embodiment, the exemplary circuit 300 in FIG. 3 operates the same as the exemplary circuit 100 in FIG. 1 without specifying R2=0.

Figure 4A:
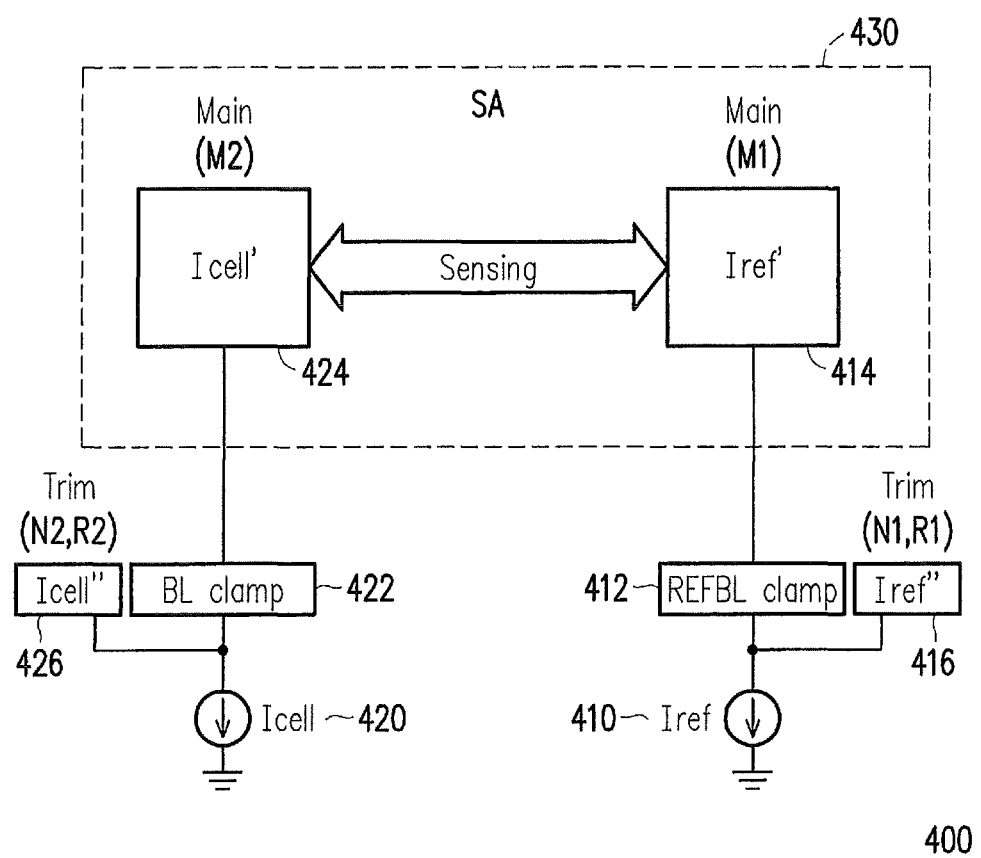
FIG. 4A illustrates a diagram of another exemplary circuit for compensating a mismatch of a sense amplifier, in accordance with some embodiments of the present disclosure.

In contrast, FIG. 4A illustrates a diagram of another exemplary circuit 400 for compensating a mismatch of a sense amplifier, in accordance with some embodiments of the present disclosure. Similar to the exemplary circuit 300 in FIG. 3, the exemplary circuit 400 includes a cell current source 420, a reference current source 410, a bit line clamp 422 coupled to the cell current source 420, a reference bit line clamp 412 coupled to the reference current source 410, and a sense amplifier 430 electrically connected to the bit line clamp 422 and the reference bit line clamp 412. The sense amplifier 430 includes two main branches M1 414 and M2 424 and senses a difference between the Iref' and the Icell' during a normal operation.

Different from the exemplary circuit 300 in FIG. 3, the trimming branches (N1, R1) 416 is outside the sense amplifier 430 and is connected to the reference bit line clamp 412 in parallel. Similarly, the trimming branches (N2, R2) 426 is also outside the sense amplifier 430 and is connected to the bit line clamp 422 in parallel. That is, the trimming branches are outside the sense amplifier 430 to trim the currents of main branches when there is a mismatch between the baselines of the Iref' and the Icell'. As discussed above, the trimming range for mismatch compensation is determined by M1, M2, N1, N2, while the trimming resolution is determined by R1 and R2 which are programmable or adjustable based on mismatch condition of the sense amplifier 430.

Figure 4B:
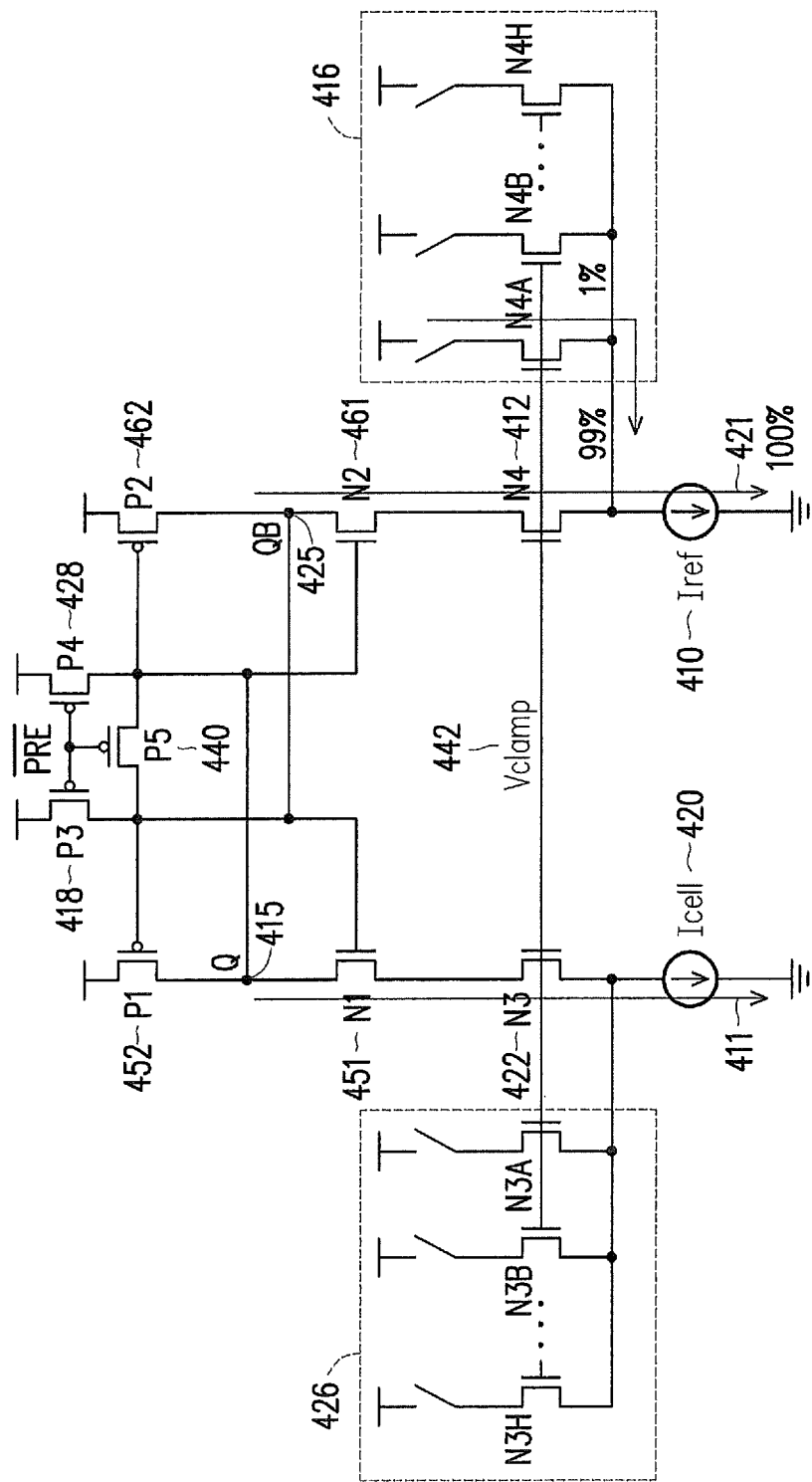
FIG. 4B illustrates an exemplary circuit corresponding to the diagram in FIG. 4A for compensating a mismatch of a sense amplifier, in accordance with some embodiments of the present disclosure.

FIG. 4B illustrates an exemplary circuit corresponding to the circuit 400 in FIG. 4A for compensating a mismatch of a sense amplifier, in accordance with some embodiments of the present disclosure. As shown in FIG. 4B, the exemplary circuit includes a cell current source 420 and a reference current source 410. The cell current source 420 has a cell current Icell based on a logical state (e.g., high or low) of a memory bit of the memory array. The reference current source 410 generates a reference current Iref as a point of dedicated reference for determining the logical state of the memory bit by the cell current Icell.

As shown in FIG. 4B, the exemplary circuit further includes a first branch comprising a first transistor P1 452, a second transistor N1 451, and a first node Q 415 coupled between the first transistor P1 452 and the second transistor N1 451. In addition, the exemplary circuit further includes a second branch comprising a third transistor P2 462, a fourth transistor N2 461, and a second node QB 425 coupled between the third transistor P2 462 and the fourth transistor N2 461. The first node Q 415 is coupled to respective gates of the third transistor P2 462 and the fourth transistor N2 461. The second node QB 425 is coupled to respective gates of the first transistor P1 452 and the second transistor N1 451. As such, the first transistor P1 452, the second transistor N1 451, the third transistor P2 462, and the fourth transistor N2 461 form a cross-couple latch structure to amplify the sensed differential signal between the first node Q 415 and the second node QB 425.

As shown in FIG. 4B, the exemplary circuit further includes a first clamping transistor N3 422 coupled to the cell current source 420, and a second clamping transistor N4 412 coupled to the reference current source 410. In one embodiment, both the cell current source 420 and the reference current source 410 are memory bit cells. The first signal level of the current 411 serves as a cell signal for the sense amplifier, while the second signal level of the current 421 serves as a reference signal for the sense amplifier. A clamping voltage Vclamp 442 may be coupled to the respective gates of the first clamping transistor N3 422 and the second clamping transistor N4 412 to set a cap or upper limit on the gate voltages for the bit line (cell side) and the reference bit line (reference side).

In addition, the exemplary circuit further includes a first plurality of trimming transistors 426 coupled to the first clamping transistor N3 422 in parallel and a second plurality of trimming transistors 416 coupled to the second clamping transistor N4 412 in parallel. In some embodiments, each of the first and second pluralities of trimming transistors 426, 416 are controlled (e.g., turned on or off) by a respective switch. As such, each of the first plurality of trimming transistors 426 is capable of being selectively conducted to reduce a first signal level of current flowing through the first branch, while each of the second plurality of trimming transistors 416 is capable of being selectively conducted to reduce a second signal level of current flowing through the second branch.

In one embodiment, each of the first plurality of trimming transistors 426, when individually conducted, reduces the first signal level of current flowing through the first branch by a first percentage, while each of the second plurality of trimming transistors 416, when individually conducted, reduces the second signal level of current flowing through the second branch by a second percentage. In the example shown in FIG. 4B, the second percentage is 1%, and there are eight trimming transistors on each side, i.e. trimming transistors N3A, N3B . . . N3H on the cell side, and trimming transistors N4A, N4B . . . N4H on the reference side.

The sense amplifier circuit in FIG. 4B senses a difference between the current 411 flowing through the first node Q 415 and the current 421 flowing through the second node QB 425 during a normal operation. Due to symmetric structures of the sense amplifier circuit, the current 411 flowing through the first node Q 415 should have a same baseline as the current 421 flowing through the second node QB 425 during a tuning process when there is no mismatch between the two branches. For example, the second transistor N1 451 and the fourth transistor N2 461 are manufactured based on a same process and should match each other when there is no process variation; the first clamping transistor N3 422 and the second clamping transistor N4 412 are manufactured based on a same process and should match each other when there is no process variation. But due to the unavoidable process variations, a mismatch can exist between the first clamping transistor N3 422 and the second clamping transistor N4 412, between the second transistor N1 451 and the fourth transistor N2 461, etc., to cause a difference between the current 411 and the current 421 during a tuning process.

To compensate a mismatch between the baselines of the current 411 flowing through the first node Q 415 and the current 421 flowing through the second node QB 425, one or more of the trimming transistors 426, 416 may be turned on or conducted to reduce or trim current flowing through the first node Q 415 and/or the second node QB 425. Turning on and off a trimming transistor may be based on a digitally controlled switch, a program, or a manual operation. In one example, the mismatch indicates a stronger current flowing through the first node Q 415 than that flowing through the second node QB 425. Then the first plurality of trimming transistors 426 comprises a first number of conducted trimming transistors to reduce the first signal level of current 411 flowing through the first branch to compensate the mismatch. The first number is determined based on the first percentage and the mismatch. In another example, the mismatch indicates a stronger current flowing through the second node QB 425 than that flowing through the first node Q 415. Then the second plurality of trimming transistors 416 comprises a second number of conducted trimming transistors to reduce the second signal level of current 421 flowing through the second branch to compensate the mismatch. The second number is determined based on the second percentage and the mismatch. As shown in FIG. 4B, each of the second plurality of trimming transistors N4A, N4B . . . N4H 416, when individually conducted, reduces the second signal level of current 421 flowing through the second branch by 1%. That is, the second clamping transistor N4 412 is equivalent to 100 N4A trimming transistors connected in parallel. When N4A is turned on and N4B . . . N4H are turned off, the current flowing through the second node QB 425 is trimmed from 100% to 99%.

In addition, the exemplary circuit further includes a transistor P3 418 coupled to the second node QB 425, a transistor P4 428 coupled to the first node Q 415, and a transistor P5 440 connected between the respective gates of the first transistor P1 452 and the third transistor P2 462. The respective gates of the transistor P3 418, the transistor P4 428, and the transistor P5 440 are coupled to each other in this exemplary memory structure. Other memory structures may also be applied with trimming branches added as disclosed herein for mismatch compensation. The mismatch compensation as shown in FIG. 4B can be performed only once before the usage of the sense amplifier. Once each trimming transistor is configured or adjusted to be turned on or off for mismatch compensation, the configurations are recorded and there is no need to compensate or cancel mismatch each time when the sense amplifier operates or reads.

Figure 5A:
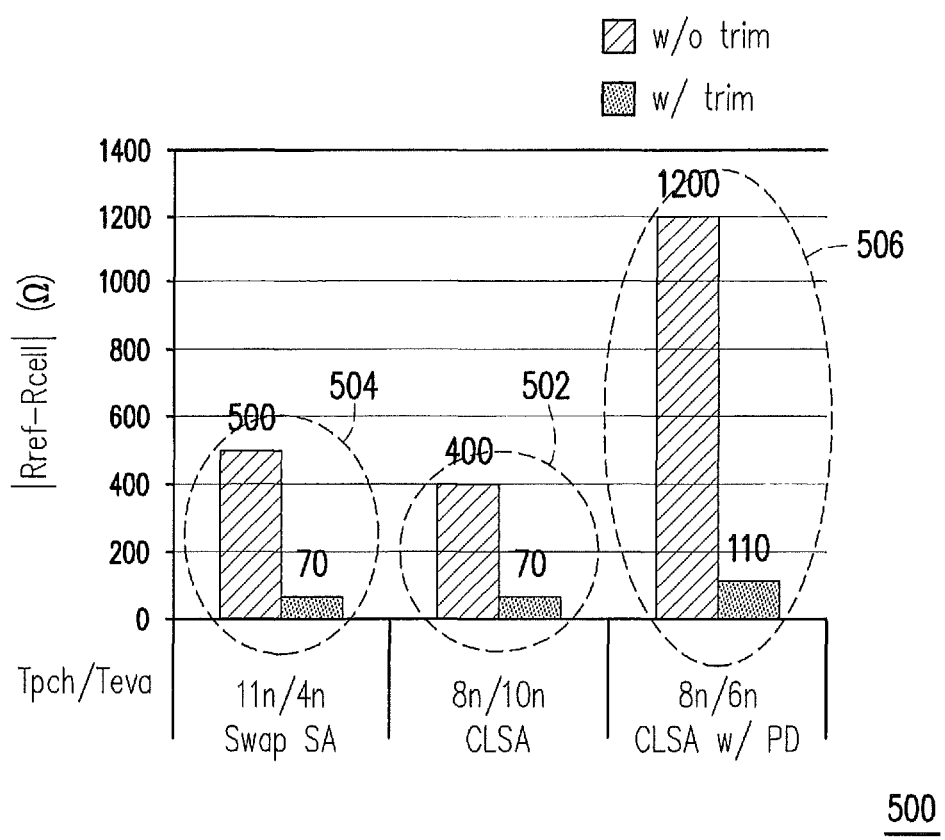
FIG. 5A illustrates minimum read window performances of exemplary sense amplifier circuits, in accordance with some embodiments of the present disclosure.

FIG. 5A illustrates minimum read window performances 500 of exemplary sense amplifier circuits, in accordance with some embodiments of the present disclosure. The disclosed trimming method can be implemented in various sense amplifier schemes, e.g. swap sense amplifier (SA) 504, current latched sense amplifier (CLSA) 502, and CLSA with additional pull-down device (PD) 506. Minimum read window represents a sensitivity of a sense amplifier and is a performance indicator for the sense amplifier. Minimum read window can be represented by an absolute difference between load resistances on the cell side and the reference side, i.e. |Rref−Rcell|. In some embodiments, when there is a mismatch between cell and reference baselines, the resistance or current difference between the cell side and the reference side is larger than the mismatch to be detected by the sense amplifier. Otherwise, the sense amplifier will have bit detection error. The minimum read window is the minimum resistance difference that can be detected by the sense amplifier. As such, the smaller the remaining mismatch of a sense amplifier is, the smaller the minimum read window of the sense amplifier is.

As shown in FIG. 5A, the minimum read window for a swap SA 504 is reduced from 500 ohms to 70 ohms after adding the trimming branches as disclosed above, with the pre-charge time set to 11 nanoseconds and the evaluation time set to 4 nanoseconds. In addition, the minimum read window for a CLSA 502 is reduced from 400 ohms to 70 ohms after adding the trimming branches as disclosed above, with the pre-charge time set to 8 nanoseconds and the evaluation time set to 10 nanoseconds. Furthermore, the minimum read window may be reduced for a CLSA with an additional PD 506 to shorten read time, which is a sum of pre-charge time (Tpch) and evaluation time (Teva). The minimum read window for a CLSA with an additional PD 506 can be reduced from 1200 ohms to 110 ohms after adding the trimming branches as disclosed above, with the pre-charge time set to 8 nanoseconds and the evaluation time set to 6 nanoseconds. In the above examples, the Rref is about 8000 ohms. As such, taking the example of the CLSA 502, adding the trimming branches can reduce its minimum read window from 5% (400/8000) to less than 1% (70/8000), percentage-wise. Exemplary circuits for compensating a mismatch of a CLSA 502 has been shown in FIG. 2 and FIG. 4B. For example, the circuit components in FIG. 2 excluding the trimming branches 217, 227 form a CLSA; and the circuit components in FIG. 4B excluding the trimming branches 426, 416 also form a CLSA.

Figure 5B:
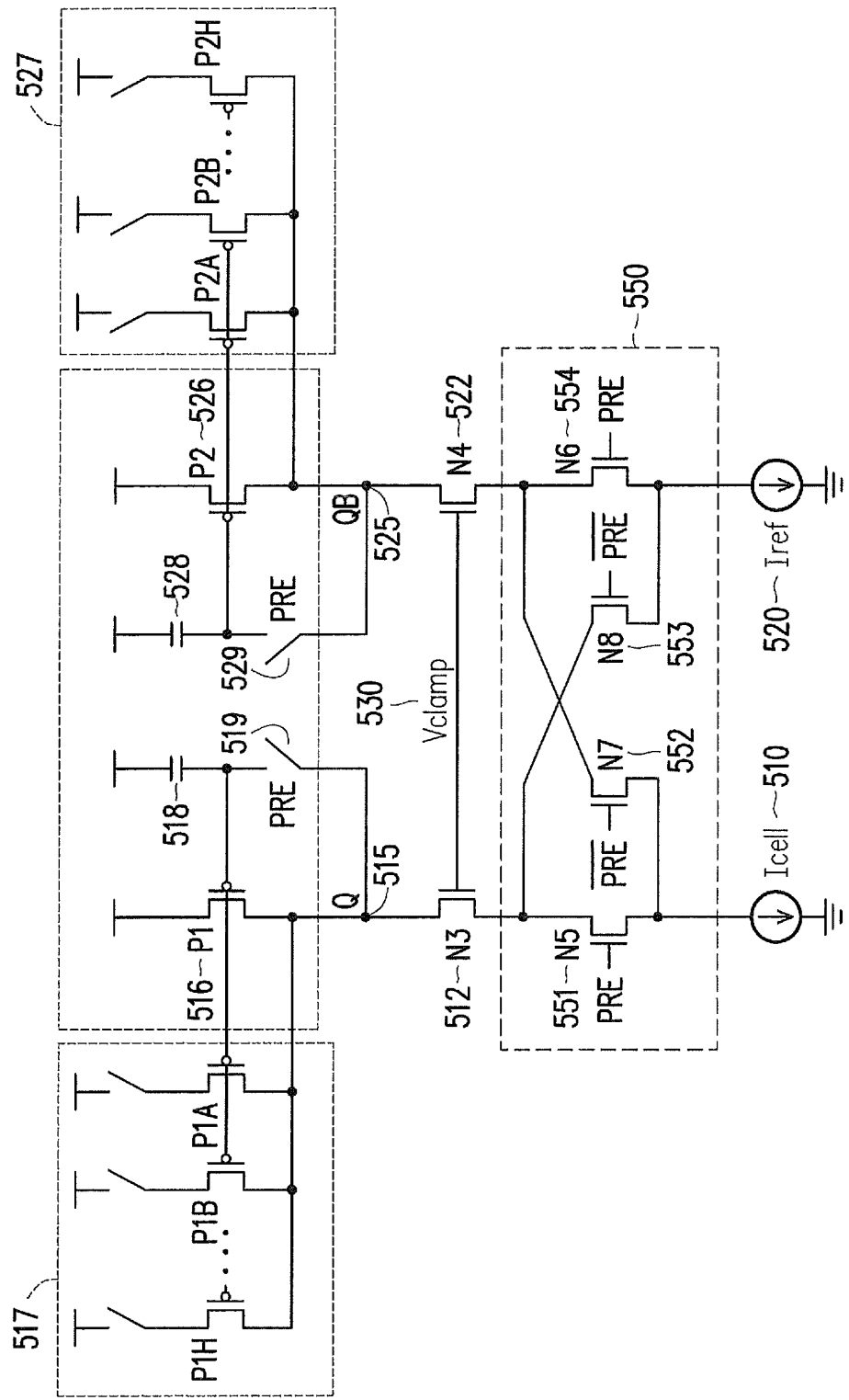
FIG. 5B illustrates an exemplary circuit for compensating a mismatch of a swap sense amplifier (SA), in accordance with some embodiments of the present disclosure.

FIG. 5B illustrates an exemplary circuit for compensating a mismatch of a swap SA 504 as shown in FIG. 5A, in accordance with some embodiments of the present disclosure. As shown in FIG. 5B, the swap SA circuit includes a cell current source 510 and a reference current source 520. The cell current source 510 has a cell current Icell based on a logical state (e.g., high or low) of a memory bit of the memory array. The reference current source 520 generates a reference current Iref as a point of dedicated reference for determining the logical state of the memory bit by the cell current Icell.

As shown in FIG. 5B, the swap SA circuit further includes a first branch comprising a first transistor P1 516, a second transistor N3 512, and a first node Q 515 coupled between the first transistor P1 516 and the second transistor N3 512. In addition, the swap SA circuit further includes a second branch comprising a third transistor P2 526, a fourth transistor N4 522, and a second node QB 525 coupled between the third transistor P2 526 and the fourth transistor N4 522. The first node Q 515 is coupled to a gate of the first transistor P1 516 and a capacitor 518 via a switch 519. The second node QB 525 is coupled to a gate of the third transistor P2 526 and a capacitor 528 via a switch 529. As such, the first transistor P1 516, the third transistor P2 526, the capacitor 518, the capacitor 528, the switch 519 and the switch 529 form a current sampling circuit for the swap SA.

In addition, the swap SA circuit further includes a first plurality of trimming transistors 517 coupled to the first transistor P1 516 in parallel and a second plurality of trimming transistors 527 coupled to the third transistor P2 526 in parallel. In some embodiments, each of the first and second pluralities of trimming transistors 517, 527 are controlled (e.g., turned on or off) by a respective switch. As such, each of the first plurality of trimming transistors 517 is capable of being selectively conducted to reduce a first signal level of current flowing through the first branch, while each of the second plurality of trimming transistors 527 is capable of being selectively conducted to reduce a second signal level of current flowing through the second branch. The circuit components in FIG. 5B excluding the trimming branches 517, 527 form a swap SA.

In one embodiment, each of the first plurality of trimming transistors 517, when individually conducted, reduces the first signal level of current flowing through the first branch by a first percentage, while each of the second plurality of trimming transistors 527, when individually conducted, reduces the second signal level of current flowing through the second branch by a second percentage. In one example, the second percentage is 1%, and there are eight trimming transistors on each side, i.e. trimming transistors P1A, P1B . . . P1H on the cell side, and trimming transistors P2A, P2B . . . P2H on the reference side.

In one embodiment, both the cell current source 510 and the reference current source 520 are memory bit cells. The first signal level of the current serves as a cell signal for the sense amplifier, while the second signal level of the current serves as a reference signal for the sense amplifier. A clamping voltage Vclamp 530 may be coupled to the respective gates of the second transistor N3 512 and the fourth transistor N4 522 to set a cap or upper limit on the gate voltages for the bit line (cell side) and the reference bit line (reference side).

In addition, the swap SA circuit further includes a swap structure 550 that includes: a transistor N5 551 coupled between the transistor N3 512 and the cell current source 510, a transistor N6 554 coupled between the transistor N4 522 and the reference current source 520, a transistor N7 552 coupled between the transistor N4 522 and the cell current source 510, and a transistor N8 553 coupled between the transistor N3 512 and the reference current source 520. Gates of the transistor N5 551 and the transistor N6 554 are coupled to a pre-charge (PRE) signal; while gates of the transistor N7 552 and the transistor N8 553 are coupled to a negative PRE signal.

The swap SA circuit senses a difference between the current flowing through the first node Q 515 and the current flowing through the second node QB 525 during a sense operation. Due to symmetric structures of the swap SA circuit, the current flowing through the first node Q 515 should have a same baseline as the current flowing through the second node QB 525 during a tuning process when there is no mismatch between the two branches. For example, the second transistor N3 512 and the fourth transistor N4 522 are manufactured based on a same process and should match each other when there is no process variation; the first transistor P1 516 and the third transistor P2 526 are manufactured based on a same process and should match each other when there is no process variation. But due to the unavoidable process variations, a mismatch can exist between the first transistor P1 516 and the third transistor P2 526, between the second transistor N2 512 and the fourth transistor N4 522, etc., to cause a difference between the current and the current during a tuning process.

To compensate a mismatch between the baselines of the current flowing through the first node Q 515 and the current flowing through the second node QB 525, the swap SA performs a sense operation which include two phases: a pre-charge phase and a sensing phase.

During the pre-charge phase, the PRE signal has a logic value 1, and the negative PRE signal has a logic value 0. This means the switches 519, 529 are closed. As such, the first transistor P1 516 and the third transistor P2 526 are operated as diode-connected, which means for each of first transistor P1 516 and the third transistor P2 526, its gate is connected to its drain, via the first node Q 515 or the second node QB 525. One or more of the trimming transistors 517, 527 may be turned on or conducted to reduce or trim current flowing through the first node Q 515 and/or the second node QB 525. During the pre-charge phase, the cell current Icell flows through the transistor N5 551, while the reference current Iref flows through the transistor N6 554. Therefore, during the pre-charge phase, the cell current Icell and the reference current Iref are sampled by the first transistor P1 516 and the third transistor P2 526, respectively.

Turning on and off a trimming transistor may be based on a digitally controlled switch, a program, or a manual operation. In one example, the mismatch indicates a stronger current flowing through the first node Q 515 than that flowing through the second node QB 525. Then the first plurality of trimming transistors 517 comprises a first number of conducted trimming transistors to reduce the first signal level of current flowing through the first branch to compensate the mismatch. The first number is determined based on the first percentage and the mismatch. In another example, the mismatch indicates a stronger current flowing through the second node QB 525 than that flowing through the first node Q 515. Then the second plurality of trimming transistors 527 comprises a second number of conducted trimming transistors to reduce the second signal level of current flowing through the second branch to compensate the mismatch. The second number is determined based on the second percentage and the mismatch.

During the sensing phase, the PRE signal has a logic value 0, and the negative PRE signal has a logic value 1. This means the switches 519, 529 are open. As such, each of the first transistor P1 516 and the third transistor P2 526 operates as a current source to provide the sampled current in the pre-charge phase. The trimming branches (including the trimming transistors P1A, P1B . . . P1H, and the trimming transistors P2A, P2B . . . P2H) are off. During the sensing phase, the cell current Icell flows through the transistor N7 552 to fight against P2 current to develop a voltage at the second node QB 525. The voltage at the second node QB 525 is determined based on both the cell current Icell and the P2 current. The cell current Icell, when just entering the sensing phase, is still the same as the P1 current developed during the pre-charge phase. As such, a stable current flowing through the second node QB 525 will be between the P1 current and the P2 current. The reference current Iref flows through the transistor N8 553 to fight against P1 current to develop a voltage at the first node Q 515, as the voltage at the first node Q 515 is determined based on both the reference current Iref and the P1 current. The reference current Iref, when just entering the sensing phase, is still the same as the P2 current developed during the pre-charge phase. As such, a stable current flowing through the first node Q 515 will be between the P1 current and the P2 current. In this case, the two voltages at the first node Q 515 and the second node QB 525 are developed in opposite direction, i.e. one voltage is increased and the other voltage is decreased, to balance or compensate the mismatch. For example, if the P1 current is larger than the P2 current during the pre-charge phase, the P1 current will decrease during the sensing phase while the P2 current will increase during the sensing phase, which compensates the mismatch between the P1 current and the P2 current. Accordingly, at the sensing phase, the voltage at the first node Q 515 will decrease and the voltage at the second node QB 525 will increase.

In some embodiments, the mismatch compensation as shown in FIG. 5B may be performed once before the usage of the sense amplifier. Once each trimming transistor is configured or adjusted to be turned on or off for mismatch compensation, the configurations are recorded and there is no compensation or cancelation of mismatch each time the sense amplifier operates or reads.

Figure 5C:
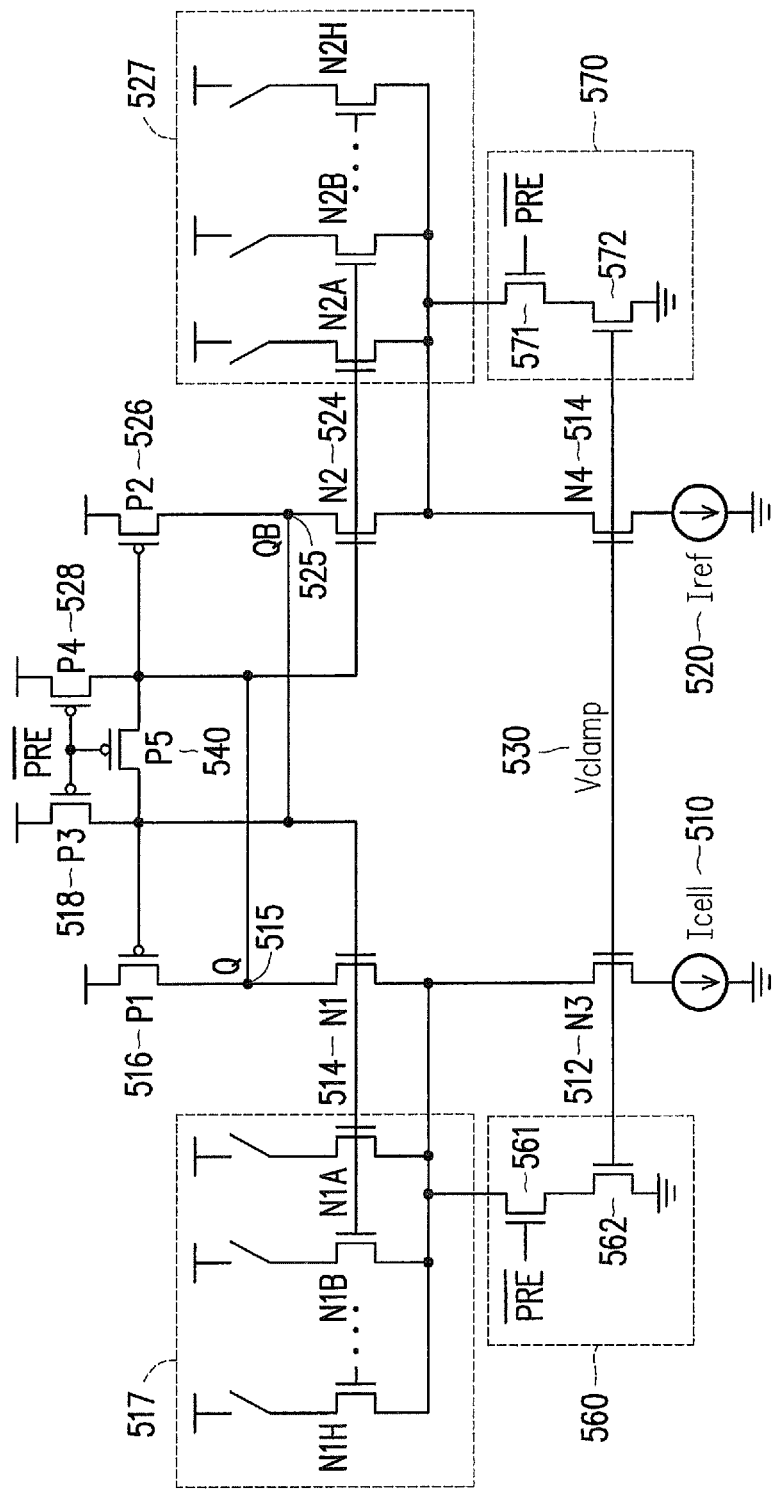
FIG. 5C illustrates an exemplary circuit for compensating a mismatch of a current latched sense amplifier (CLSA) with additional pull-down device (PD), in accordance with some embodiments of the present disclosure.

FIG. 5C illustrates an exemplary circuit for compensating a mismatch of a CLSA with additional PD 506 as shown in FIG. 5A, in accordance with some embodiments of the present disclosure. As shown in FIG. 5C, the CLSA with PD circuit includes a cell current source 510 and a reference current source 520. The cell current source 510 has a cell current Icell based on a logical state (e.g., high or low) of a memory bit of the memory array. The reference current source 520 generates a reference current Iref as a point of dedicated reference for determining the logical state of the memory bit by the cell current Icell.

As shown in FIG. 5C, the CLSA with PD circuit further includes a first branch comprising a first transistor P1 516, a second transistor N1 514, and a first node Q 515 coupled between the first transistor P1 516 and the second transistor N1 514. In addition, the CLSA with PD circuit further includes a second branch comprising a third transistor P2 526, a fourth transistor N2 524, and a second node QB 525 coupled between the third transistor P2 526 and the fourth transistor N2 524. The first node Q 515 is coupled to respective gates of the third transistor P2 526 and the fourth transistor N2 524. The second node QB 525 is coupled to respective gates of the first transistor P1 516 and the second transistor N1 514. As such, the first transistor P1 516, the second transistor N1 514, the third transistor P2 526, and the fourth transistor N2 524 form a cross-couple latch structure to amplify the sensed differential signal between the first node Q 515 and the second node QB 525.

In addition, the CLSA with PD circuit further includes a first plurality of trimming transistors 517 coupled to the second transistor N1 514 in parallel and a second plurality of trimming transistors 527 coupled to the fourth transistor N2 524 in parallel. In some embodiments, each of the first and second pluralities of trimming transistors 517, 527 are controlled (e.g., turned on or off) by a respective switch. As such, each of the first plurality of trimming transistors 517 is capable of being selectively conducted to reduce a first signal level of current flowing through the first branch, while each of the second plurality of trimming transistors 527 is capable of being selectively conducted to reduce a second signal level of current flowing through the second branch.

In one embodiment, each of the first plurality of trimming transistors 517, when individually conducted, reduces the first signal level of current flowing through the first branch by a first percentage, while each of the second plurality of trimming transistors 527, when individually conducted, reduces the second signal level of current flowing through the second branch by a second percentage. In one example, the second percentage is 1%, and there are eight trimming transistors on each side, i.e. trimming transistors N1A, N1B ... N1H on the cell side, and trimming transistors N2A, N2B ... N2H on the reference side.

The CLSA with PD circuit senses a difference between the current flowing through the first node Q 515 and the current flowing through the second node QB 525 during a normal operation. Due to symmetric structures of the CLSA with PD circuit, the current flowing through the first node Q 515 should have a same baseline as the current flowing through the second node QB 525 during a tuning process when there is no mismatch between the two branches. For example, the second transistor N1 514 and the fourth transistor N2 524 are manufactured based on a same process and should match each other when there is no process variation; the first transistor P1 516 and the third transistor P2 526 are manufactured based on a same process and should match each other when there is no process variation. But due to the unavoidable process variations, a mismatch can exist between the first transistor P1 516 and the third transistor P2 526, between the second transistor N1 514 and the fourth transistor N2 524, etc., to cause a difference between the current and the current during a tuning process.

To compensate a mismatch between the baselines of the current flowing through the first node Q 515 and the current flowing through the second node QB 525, one or more of the trimming transistors 517, 527 may be turned on or conducted to reduce or trim current flowing through the first node Q 515 and/or the second node QB 525. Turning on and off a trimming transistor may be based on a digitally controlled switch, a program, or a manual operation. In one example, the mismatch indicates a stronger current flowing through the first node Q 515 than that flowing through the second node QB 525. Then the first plurality of trimming transistors 517 comprises a first number of conducted trimming transistors to reduce the first signal level of current flowing through the first branch to compensate the mismatch. The first number is determined based on the first percentage and the mismatch. In another example, the mismatch indicates a stronger current flowing through the second node QB 525 than that flowing through the first node Q 515. Then the second plurality of trimming transistors 527 comprises a second number of conducted trimming transistors to reduce the second signal level of current flowing through the second branch to compensate the mismatch. The second number is determined based on the second percentage and the mismatch.

As shown in FIG. 5C, the CLSA with PD circuit further includes a first clamping transistor 512 coupled to the cell current source 510, and a second clamping transistor 522 coupled to the reference current source 520. In one embodiment, both the cell current source 510 and the reference current source 520 are memory bit cells. The first signal level of the current serves as a cell signal for the sense amplifier, while the second signal level of the current serves as a reference signal for the sense amplifier. A clamping voltage Vclamp 530 may be coupled to the respective gates of the first clamping transistor 512 and the second clamping transistor 5222 to set a cap or upper limit on the gate voltages for the bit line (cell side) and the reference bit line (reference side).

In addition, the CLSA with PD circuit further includes pull-down structures 560, 570. The pull-down structure 560 includes a transistor 561 and a transistor 562. The transistor 561 is coupled between the transistor 562 and the trimming transistors 517; while the transistor 562 is coupled between the transistor 561 and a ground. The gate of the transistor 561 is coupled to a negative PRE signal; and the gate of the transistor 562 is coupled to the clamping voltage Vclamp 530. Similarly, the pull-down structure 570 includes a transistor 571 and a transistor 572. The transistor 571 is coupled between the transistor 572 and the trimming transistors 527; while the transistor 572 is coupled between the transistor 571 and a ground. The gate of the transistor 571 is coupled to a negative PRE signal; and the gate of the transistor 572 is coupled to the clamping voltage Vclamp 530.

The pull-down circuits 560, 570 can shorten the sensing phase. When Icell and Iref become smaller, the development of the sensing nodes Q 515 and QB 525 will become slower. To speed up the sensing phase and the development of the sensing nodes Q 515 and QB 525, pull-down paths are added into the CLSA with PD circuit to enlarge the currents which discharge the sensing nodes Q 515 and QB 525, respectively. In one embodiment, the pull-down paths are enabled only in the sensing phase to save power. The transistor 561 and the transistor 571 serve as the control gates to enable or disable the two pull-down paths of the pull-down circuits 560, 570, respectively. Each of the transistor 562 and the transistor 572 operates as a current source. In general, the gates of the transistor 562 and the transistor 572 may be connected any analog bias to generate current. In this case, gates of the transistor 562 and the transistor 572 are connected to the Vclamp 530 to reduce the number of analog bias.

Figure 6:
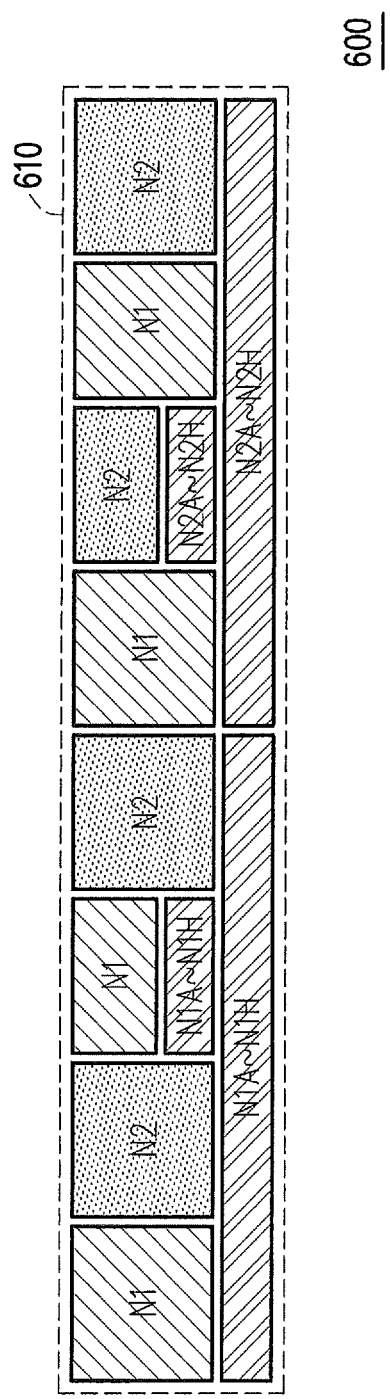
FIG. 6 illustrates an exemplary floor plan for branch layouts of sense amplifier circuits on a wafer, in accordance with some embodiments of the present disclosure.

In addition, the CLSA with PD circuit further includes a transistor P3 518 coupled to the second node QB 525, a transistor P4 528 coupled to the first node Q 515, and a transistor P5 540 connected between the respective gates of the first transistor P1 516 and the third transistor P2 526. The respective gates of the transistor P3 518, the transistor P4 528, and the transistor P5 540 are coupled to each other in this exemplary memory structure. Other memory structures may also be applied with trimming branches added as disclosed herein for mismatch compensation. The mismatch compensation as shown in FIG. 5C may be performed only once before the usage of the sense amplifier. Once each trimming transistor is configured or adjusted to be turned on or off for mismatch compensation, the configurations are recorded and there is no need to compensate or cancel mismatch each time when the sense amplifier operates or reads FIG. 6 illustrates an exemplary floor plan 600 for branch layouts of sense amplifier circuits on a wafer, in accordance with some embodiments of the present disclosure. FIG. 6 shows a plurality of chunks on a portion 610 of a wafer. The chunks include transistors N1 and N2 in main branches, and trimming transistors N1A~N1H and N2A~N2H in trimming branches, corresponding to the trimming transistors in FIG. 2, FIG. 4B, FIG. 5B or FIG. 5C. Each of these transistors may be cut from a piece in a corresponding chunk in the exemplary floor plan 600 of FIG. 6. To avoid non-uniformity of a wafer, e.g. a difference between inner diameter (ID) and outer diameter (OD) of the wafer, the chunks corresponding to different transistors in different branches can be alternated as shown in the exemplary floor plan 600 of FIG. 6. In one embodiment, the N1 transistor and its corresponding trimming transistors N1A~N1H are formed in a same portion of the wafer; while the N2 transistor and its corresponding trimming transistors N2A~N2H are formed in a same portion of the wafer.

Figure 7:
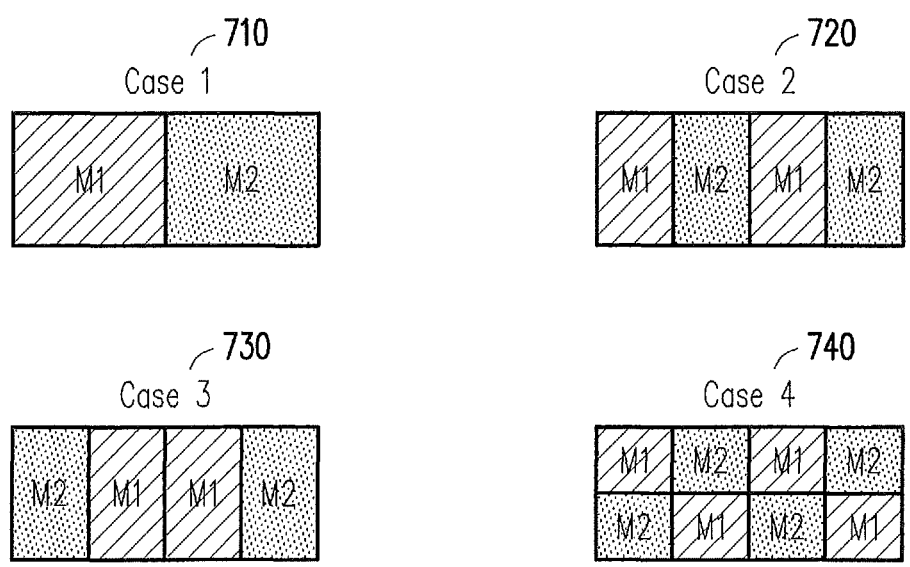
FIG. 7 illustrates exemplary floor plans for main branch layouts of sense amplifier circuits on a wafer, in accordance with some embodiments of the present disclosure.

FIG. 7 illustrates exemplary floor plans for main branch layouts of sense amplifier circuits on a wafer, in accordance with some embodiments of the present disclosure. FIG. 7 shows four floor plan cases: case 1 710, case 2 720, case 3 730, and case 4 740. Each floor plan case in FIG. 7 shows a layout of main branches M1 and M2 corresponding to a disclosed circuit, which may be any of the exemplary circuit 100 in FIG. 1, the exemplary circuit 300 in FIG. 3, and the exemplary circuit 400 in FIG. 4A. For example, each transistor in the exemplary circuit 100 of FIG. 1 may be cut from a piece in a corresponding chunk in the case 1 710 of FIG. 7.

Figure 8:
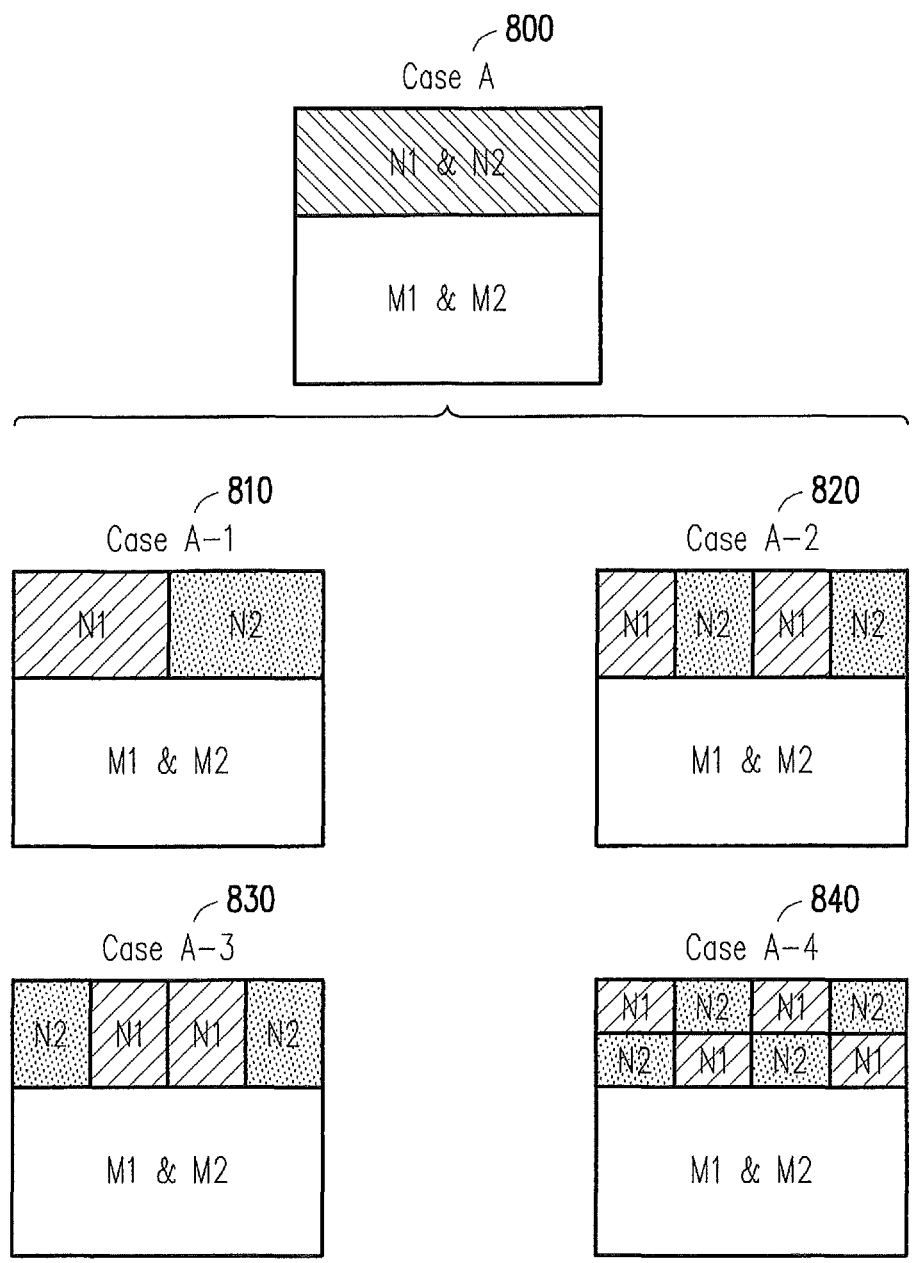
FIG. 8 illustrates exemplary floor plans for trimming branch layouts of sense amplifier circuits on a wafer, in accordance with some embodiments of the present disclosure.

FIG. 8 illustrates exemplary floor plans for trimming branch layouts of sense amplifier circuits on a wafer, in accordance with some embodiments of the present disclosure. FIG. 8 shows a floor plan case A 800 for a layout of main branches M1 and M2, and trimming branches N1 and N2, corresponding to the exemplary circuit 100 in FIG. 1, the exemplary circuit 300 in FIG. 3, and the exemplary circuit 400 in FIG. 4A. Under this floor plan 800, FIG. 8 shows four floor plan sub-cases: case A-1 810, case A-2 820, case A-3 830, and case A-4 840. Each floor plan sub-case in FIG. 8 shows a layout of trimming branches N1 and N2 corresponding to the floor plan case A 800, where the layout of the main branches M1 and M2 for each sub-case in FIG. 8 may correspond to any one of the cases shown in FIG. 7. For example, each trimming transistor in the exemplary circuit 100 of FIG. 1 may be cut from a piece in a corresponding chunk according to sub-case A-4 840 of FIG. 8; each main transistor in the exemplary circuit 100 of FIG. 1 may be cut from a piece in a corresponding chunk according to case 3 730 in FIG. 7; while the relative layout between the main branches and the trimming branches of the exemplary circuit 100 of FIG. 1 may follow the case A 800 in FIG. 8.

Figure 9:
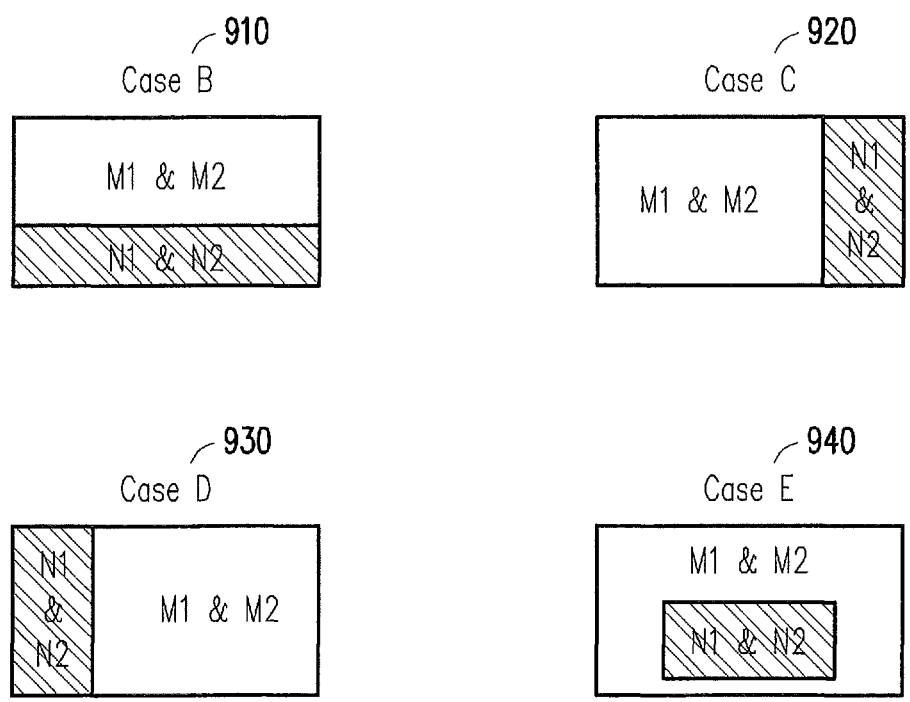
FIG. 9 illustrates other exemplary floor plans for branch layouts of sense amplifier circuits on a wafer, in accordance with some embodiments of the present disclosure.

FIG. 9 illustrates other exemplary floor plans for branch layouts of sense amplifier circuits on a wafer, in accordance with some embodiments of the present disclosure. FIG. 9 shows addition floor plan cases: case B 910, case C 920, case D 930, and case E 940. Similar to the floor plan case A 800 in FIG. 8, each of the floor plan cases in FIG. 9 indicates a relative layout between the main branches and the trimming branches, corresponding to the exemplary circuit 100 in FIG. 1, the exemplary circuit 300 in FIG. 3, and the exemplary circuit 400 in FIG. 4A. Each floor plan case in FIG. 9 may include a layout of trimming branches N1 and N2 corresponding to any one of the floor plan sub-cases A-1 810 to A-4 840 in FIG. 8, and include a layout of the main branches M1 and M2 corresponding to any one of the floor plan cases 710 to 740 in FIG. 7. For example, each trimming transistor in the exemplary circuit 100 of FIG. 1 may be cut from a piece in a corresponding chunk according to sub-case A-4 840 of FIG. 8; each main transistor in the exemplary circuit 100 of FIG. 1 may be cut from a piece in a corresponding chunk according to case 3 730 in FIG. 7; while the relative layout between the main branches and the trimming branches of the exemplary circuit 100 of FIG. 1 may follow the case E 940 in FIG. 9.

Figure 10:
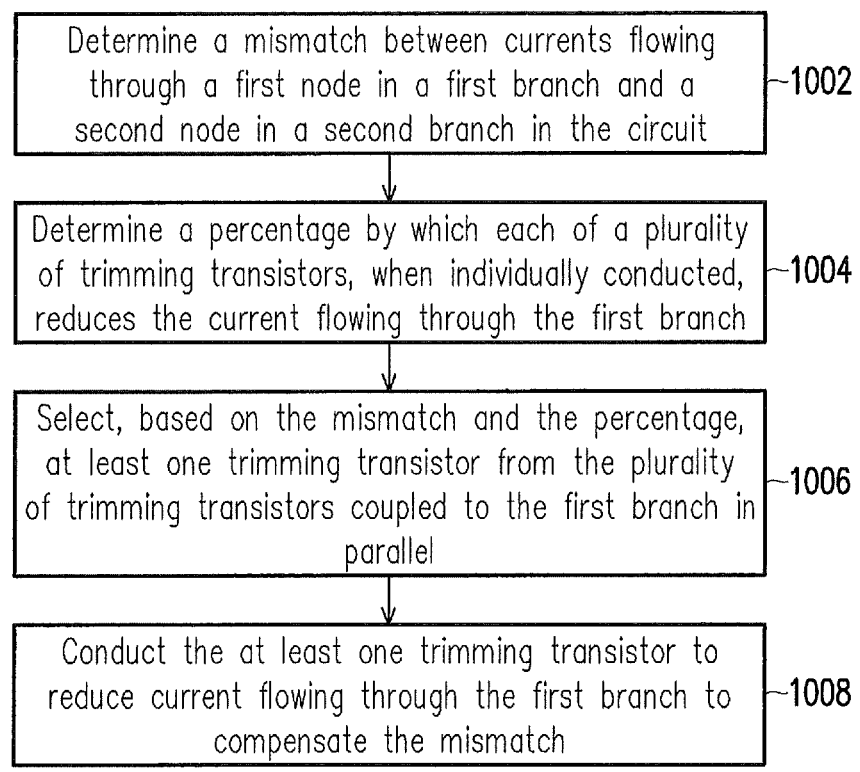
FIG. 10 shows a flow chart illustrating an exemplary method for compensating a mismatch in a circuit, in accordance with some embodiments of the present disclosure.

FIG. 10 shows a flow chart illustrating an exemplary method 1000 for compensating a mismatch in a circuit, e.g. one of the circuits shown in FIGS. 1-5, in accordance with some embodiments of the present disclosure. At operation 1002, a mismatch is determined between currents flowing through a first node in a first branch and a second node in a second branch in the circuit. At operation 1004, it is determined a percentage by which each of a plurality of trimming transistors, when individually conducted, reduces the current flowing through the first branch. Based on the mismatch and the percentage, at least one trimming transistor is selected at operation 1006 from the plurality of trimming transistors coupled to the first branch in parallel. The at least one trimming transistor is conducted or turned on at operation 1008 to reduce current flowing through the first branch to compensate the mismatch. The order of the steps shown in FIG. 10 may be changed according to different embodiments of the present disclosure.

In an embodiment, a circuit is disclosed. The circuit includes: a first branch, a second branch, a first plurality of trimming transistors and a second plurality of trimming transistors. The first branch comprises a first transistor, a second transistor, and a first node coupled between the first transistor and the second transistor. The second branch comprises a third transistor, a fourth transistor, and a second node coupled between the third transistor and the fourth transistor. The first node is coupled to respective gates of the third transistor and the fourth transistor. The second node is coupled to respective gates of the first transistor and the second transistor. The first plurality of trimming transistors is coupled to the second transistor in parallel. The second plurality of trimming transistors is coupled to the fourth transistor in parallel.

In another embodiment, a circuit is disclosed. The circuit includes: a first memory bit cell, a second memory bit cell, a first branch, a second branch, a first plurality of trimming transistors and a second plurality of trimming transistors. The first branch comprises a first clamping transistor coupled to the first memory bit cell, and a first node. A first current is configured to flow through the first node and the first clamping transistor. The second branch comprises a second clamping transistor coupled to the second memory bit cell, and a second node. A second current is configured to flow through the second node and the second clamping transistor. The first plurality of trimming transistors is coupled to the first clamping transistor in parallel. The second plurality of trimming transistors is coupled to the second clamping transistor in parallel.

In yet another embodiment, a method for compensating a mismatch in a circuit is disclosed. The method includes: determining a mismatch between currents flowing through a first node in a first branch and a second node in a second branch in the circuit, wherein the mismatch indicates a stronger current flowing through the first node than that flowing through the second node; selecting, based on the mismatch, at least one trimming transistor from a first plurality of trimming transistors coupled to the first branch in parallel; and conducting the at least one trimming transistor to reduce current flowing through the first branch to compensate the mismatch between currents flowing through the first node and the second node.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a first branch comprising a first plurality of transistors, a first memory bit cell, a first clamping transistor coupled to the first memory bit cell;
    a second branch comprising a second plurality of transistors, a second memory bit cell, a second clamping transistor coupled to the second memory bit cell;
    a first plurality of trimming transistors that are connected in parallel to each other and connected in parallel to at least one of the first plurality of transistors; and
    a second plurality of trimming transistors that are connected in parallel to each other and connected in parallel to at least one of the second plurality of transistors.

2. The circuit of claim 1, wherein:
    each of the first plurality of trimming transistors is capable of being selectively turned on to reduce a first signal level of current flowing through the first branch; and
    each of the second plurality of trimming transistors is capable of being selectively turned on to reduce a second signal level of current flowing through the second branch.

3. The circuit of claim 1, wherein:
    each of the first plurality of trimming transistors, when being individually turned on, reduces the first signal level of current flowing through the first branch by a first percentage; and
    each of the second plurality of trimming transistors, when being individually turned on, reduces the second signal level of current flowing through the second branch by a second percentage.

4. The circuit of claim 3, wherein:
    the first plurality of trimming transistors comprises a first number of turned-on trimming transistors configured to reduce the first signal level of current flowing through the first branch to compensate a mismatch between currents flowing through the first node and the second node.

5. The circuit of claim 4, wherein:
    the mismatch indicates a stronger current flowing through a first node between at least two of the first plurality of transistors than that flowing through a second node between at least two of the second plurality of transistors; and
    the first number is determined based on the first percentage and the mismatch.

6. The circuit of claim 5, wherein:
    the second plurality of trimming transistors comprises a second number of turned-on trimming transistors configured to reduce the second signal level of current flowing through the second branch to compensate a mismatch between currents flowing through the first node and the second node.

7. The circuit of claim 6, wherein:
    the mismatch indicates a stronger current flowing through the second node than that flowing through the first node; and
    the second number is determined based on the second percentage and the mismatch.

8. The circuit of claim 2, wherein the first signal level of current is configured to serve as a cell signal for a sense amplifier, and the second signal level of current is configured to serve as a reference signal for the sense amplifier.

9. The circuit of claim 5, wherein the first node is coupled to respective gates of two of the second plurality of transistors.

10. The circuit of claim 5, wherein the second node is coupled to respective gates of two of the first plurality of transistors.

* * * * *